United States Patent [19]
Hinks

[11] Patent Number: 5,378,985
[45] Date of Patent: Jan. 3, 1995

[54] FAST SPIN ECHO PRESCAN FOR MRI SYSTEM

[75] Inventor: Richard S. Hinks, Waukesha, Wis.

[73] Assignee: General Electric Company, Milwaukee, Wis.

[21] Appl. No.: 91,946

[22] Filed: Jul. 15, 1993

[51] Int. Cl.⁶ ............................................. G01V 3/00
[52] U.S. Cl. .................................... 324/309; 324/307
[58] Field of Search ............... 324/300, 307, 309, 312, 324/314

[56] References Cited

U.S. PATENT DOCUMENTS

| | | | |
|---|---|---|---|
| 4,870,361 | 9/1989 | In Den Kleef et al. | 324/309 |
| 4,876,507 | 10/1989 | Van Vaals | 324/309 |
| 5,184,073 | 2/1993 | Takeuchi et al. | 324/307 |
| 5,226,418 | 7/1993 | Bernstein et al. | 324/309 |

Primary Examiner—Louis Arana
Attorney, Agent, or Firm—Quarles & Brady

[57] ABSTRACT

A prescan process for a MR fast spin echo (FSE) pulse sequence (FIG. 2) adjusts the phases of the RF excitation pulse and RF refocusing pulses and the value of the readout gradient dephaser pulse to reduce zero order phase shifts along all axes and first order phase shifts along the slice select and readout gradient axes due to eddy currents. Another aspect of the invention is the calculation during the prescan of adjustments to receiver phase and adjustments to readout gradients which further reduce image artifacts due to phase errors produced during the FSE scan.

7 Claims, 4 Drawing Sheets

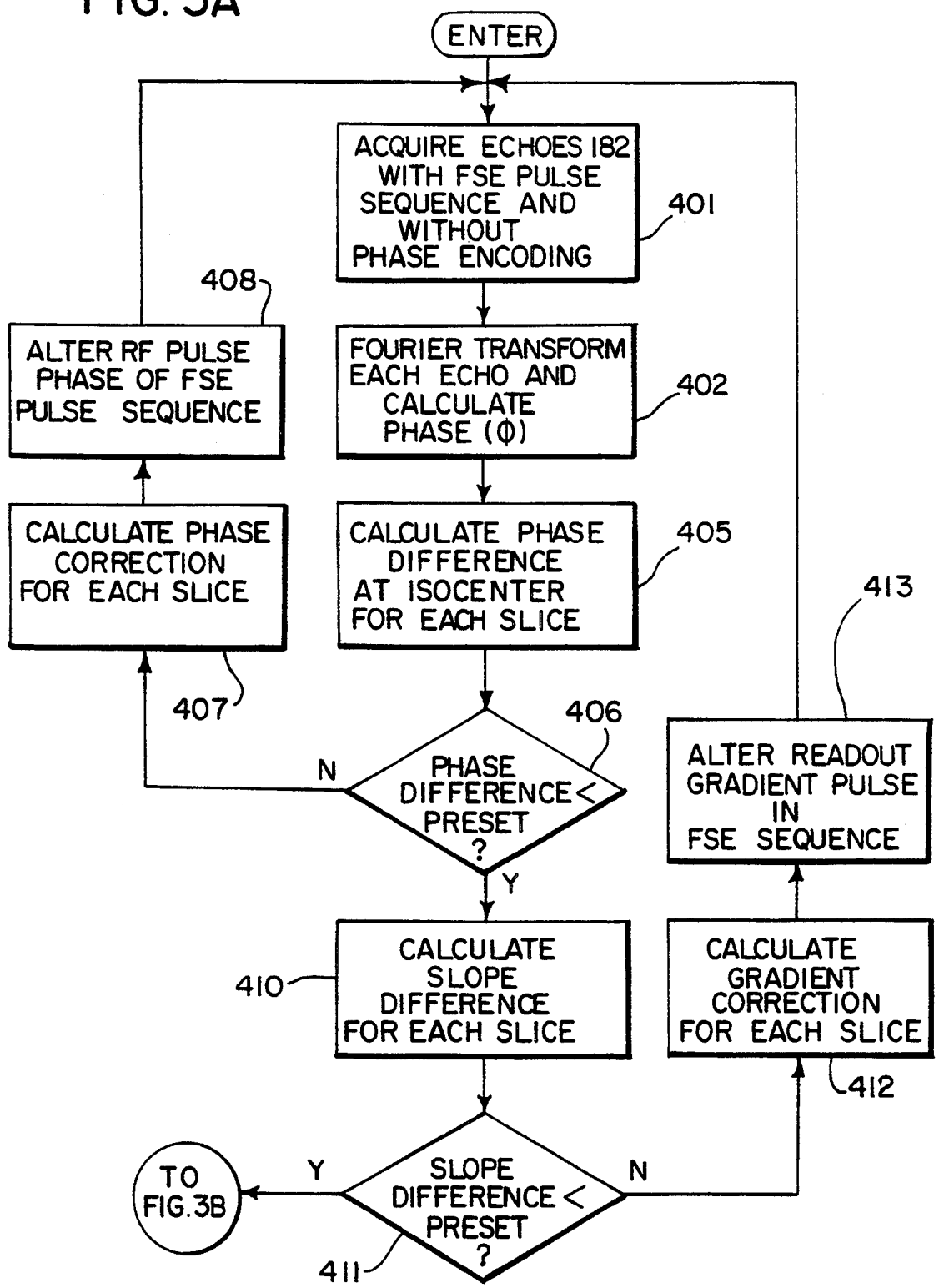

FAST SPIN ECHO PRESCAN FOR MRI SYSTEM

BACKGROUND OF THE INVENTION

The field of the invention is nuclear magnetic resonance imaging (MRI) methods and systems. More particularly, the invention relates to the compensation of fast spin echo pulse sequences to reduce image artifacts caused by eddy currents.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated and this "MR" signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image: using one of many well known reconstruction techniques.

Most MR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. One of these is the Rapid Acquisition Relaxation Enhanced (RARE) sequence which is described by J. Hennig et al in an article in *Magnetic Resonance in Medicine* 3,823–833 (1986) entitled "RARE Imaging: A Fast Imaging Method for Clinical MR." The RARE sequence is a fast spin echo sequence which utilizes RF refocused echoes generated from a Carr-Purcell-Meiboom-Gill sequence. Such fast spin echo ("FSE") scans are very susceptible to image artifacts caused by eddy currents induced by the rapidly changing magnetic field gradients. While gradient pulse compensation techniques are adequate for scans performed with most MRI pulse sequences, it has been discovered that observable image artifacts are produced by 10% to 20% of the MRI scanners performing FSE scans.

SUMMARY OF THE INVENTION

The present invention is a prescan process that is performed prior to an FSE scan to adjust the FSE pulse sequence and to thereby reduce phase errors produced by the MRI scanner. More specifically, the prescan includes: acquiring MR data using the FSE pulse sequence; calculating a phase profile for each of at least two echo signals in the acquired MR data; adjusting the relative phase of RF pulses in the FSE pulse sequence to reduce the magnitude of a phase difference value between the two phase profiles; and repeating these steps until the phase difference value is reduced below a preset amount.

A general object of the invention is to reduce phase errors in an FSE scan by adjusting the relative phase of the RF pulses in the FSE pulse sequence.

A further aspect of the invention is to reduce first order phase errors by adjusting the magnetic field gradients in the FSE pulse sequence. The difference in slope of the two phase profiles is employed to calculate an adjustment to the readout gradient and the process is repeated until the slope difference is reduced below a preset value.

BRIEF DESCRIPTION OF THE DRAWINGS

FIGS. 3A and 3B show a flow chart of the prescan process of the present invention.

DESCRIPTION OF THE PREFERRED EMBODIMENT

Figure 1:
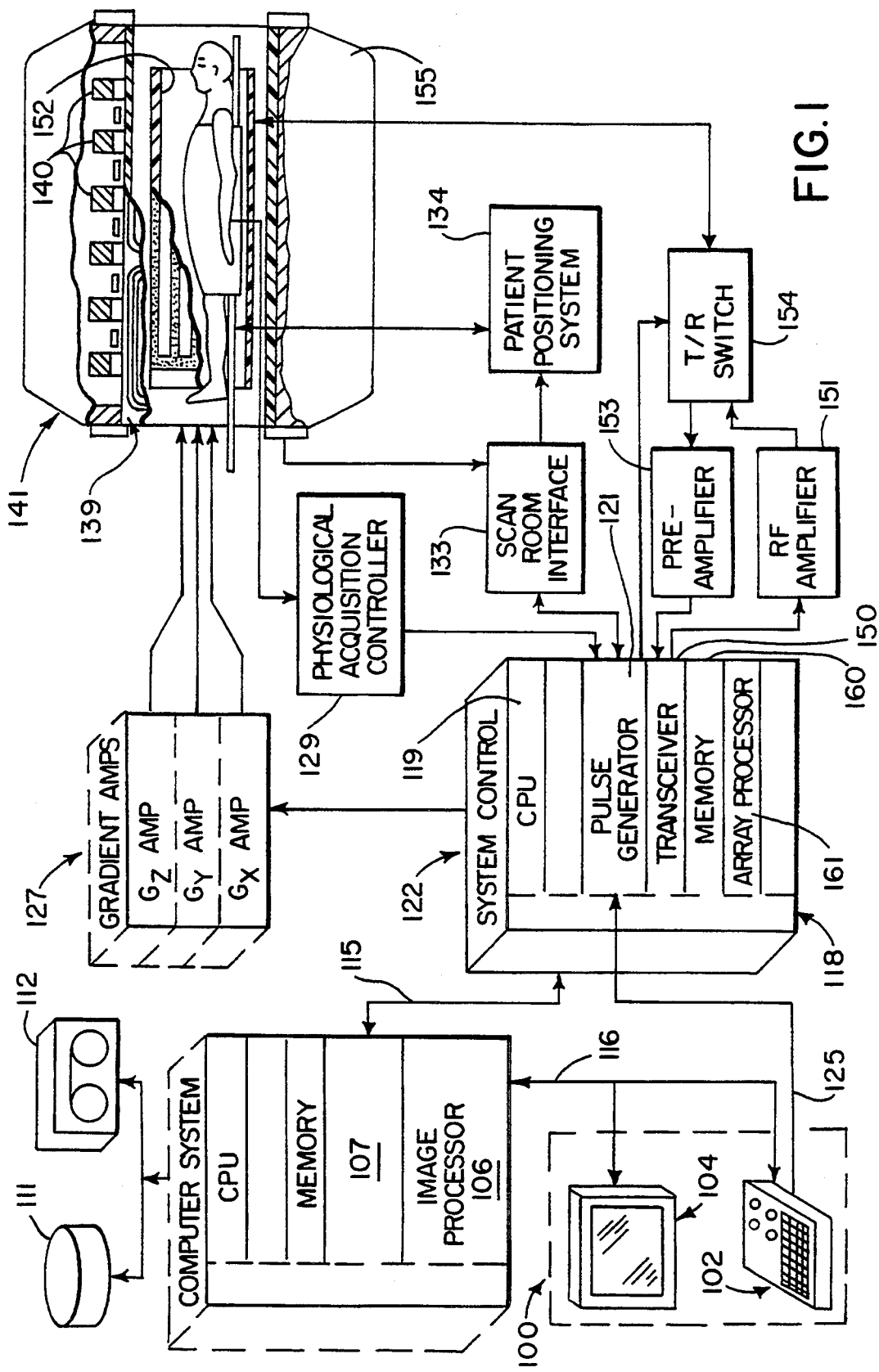
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes an image processor module 106, a CPU module 108 and a memory module 113. The computer system 107 is linked to a disk storage 111 and a tape drive 112 for storage of image data and programs, and it communicates with a separate system control 122 through a high speed serial link 115.

The system control 122 includes a CPU module 119 and a pulse generator module 121 which connects to the operator console 100 through a serial link 125. It is through this link 125 that the system control 122 receives commands from the operator which indicate the scan sequence that is to be performed. In response to these commands the pulse generator module 121 produces data which indicates the timing, strength and shape of the RF excitation pulses, the timing and length of the data acquisition window, and it connects to a set of gradient amplifiers 127, to control the timing and shape of the gradient pulses to be produced during the scan. The pulse generator module 121 also receives patient data from a physiological acquisition controller 129 that receives signals from a number of different sensors connected to the patient and it connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding the acquired MR signals. The gradient coil assembly 139 forms part of a magnet assembly 141 which also includes a polarizing magnet 140 and a whole-body RF coil 152.

A transceiver module 150 in the system control 122 produces pulses which are amplified by an RF amplifier 151 and coupled to the RF coil 152 by a transmit/receive switch 154 to produce the RF excitation field $B_1$. The MR signals radiated by the excited nuclei in the patient may be sensed by the same RF coil 152 and coupled through the transmit/receive switch 154 to a preamplifier 153. The transmit/receive switch 154 is controlled by a signal from the pulse generator module 121 to electrically connect the RF amplifier 151 to the coil 152 during the transmit mode and to connect the preamplifier 153 during the receive mode.

The MR signals picked up by the RF coil 152 are filtered, demodulated and digitized by the transceiver module 150 and transferred to a memory module 160 in the system control 122. When the scan is completed and an entire array of data has been acquired in the memory module 160, an array processor 161 Fourier transforms the data into an array of image data. This image data is conveyed through the serial link 115 to the computer system 107 where it is stored in the disk memory 111.

Figure 2:
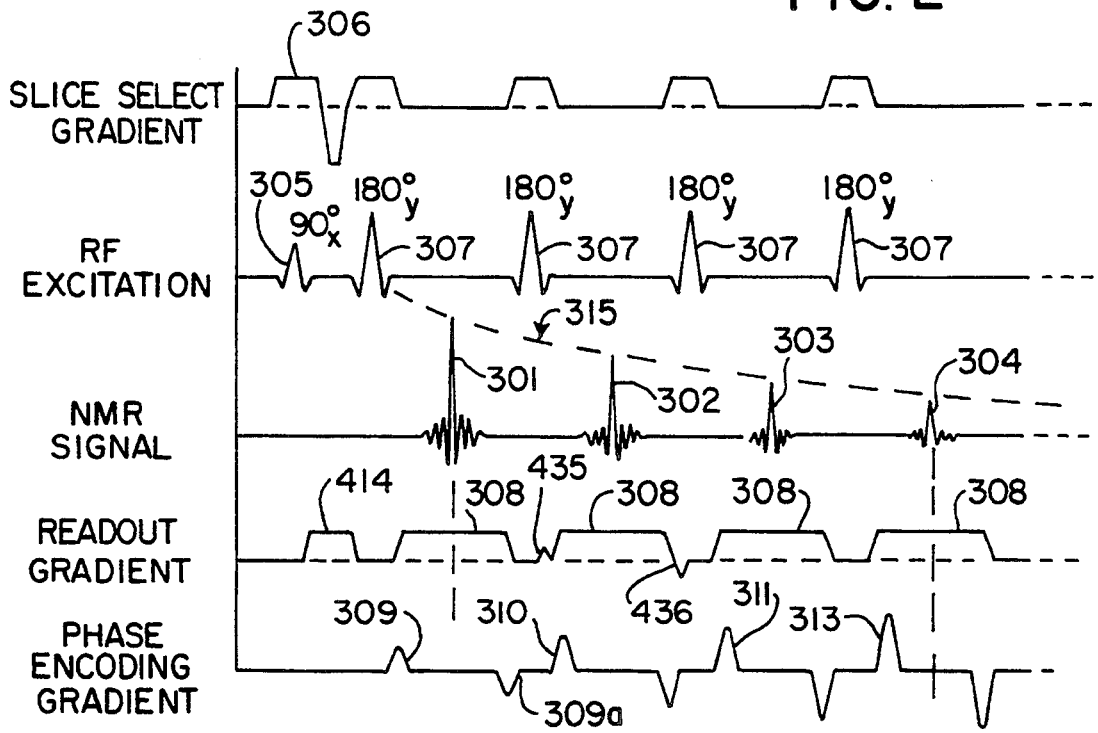
FIG. 2 is a graphic representation of an FSE pulse sequence used during the prescan of the present invention.

Referring particularly to FIG. 2, the fast spin echo MR pulse sequence employed to practice the preferred embodiment of the invention is a 2DFT RARE sequence in which sixteen MR echo signals are acquired. for clarity, only four echo signals 301-304 are shown in FIG. 2, but it can be appreciated that twelve more are produced and acquired. These MR echo signals are produced by a 90° RF excitation pulse 305 which is generated in the presence of a $G_z$ slice select gradient pulse 306 to provide transverse magnetization in a slice through the patient. This transverse magnetization is refocused by each of sixteen selective 180° RF echo pulses 307 to produce the MR spin echo signals 301-304 that are acquired in the presence of $G_x$ readout gradient pulses 308. Each MR spin echo signal 301-304 is separately phase encoded by respective $G_y$ phase encoding pulses 309-313. The magnitude of each phase encoding pulse is different, and it is stepped through 256 values to acquire 256 separate views during a complete scan. Each MR spin echo signal is acquired by digitizing 256 samples of each signal and as a result, at the completion of a scan for one image, a 256 by 256 pixel image is produced by performing a 2D Fourier transformation on the acquired data.

The FSE pulse sequence of FIG. 2 uses a CPMG (Carr-Purcell-Meiboom-Gill) echo train to encode multiple views within a single echo train (or "shot"). These echo signals must add in phase if they are to correctly encode spatial information and they must approximately follow the $T_2$ decay curve indicated by the dashed line 315. Undesired phase shifts in the echo signals result in ghosting, blurring and signal loss in the reconstructed image. Such phase shifts may occur, for example, from eddy currents which affect the gradient fields, patient motion, system mis-calibration, and coding errors. Such phase shifts may be spatially independent (i.e. zero order) or they may vary as a function of position (i.e. first and higher order) from the system isocenter. It is a discovery of the present invention that the zero order and first order phase errors can be measured during a prescan process, and the FSE pulse sequence modified to substantially eliminate image artifacts caused by these undesired phase shifts.

The FSE scan of the preferred embodiment of the invention is performed under the direction of a program executed by the MR system of FIG. 1. As will be now described, a prescan is performed just prior to the FSE scan and includes the execution of a series of FSE pulse sequences which have been modified to collect the required corrective information. This corrective information is then used to alter the FSE pulse sequence used during the scan to acquire MR data from which accurate images can be reconstructed.

Referring particularly to FIGS. 2 and 3A, the first step in the prescan process is to execute the FSE pulse sequence without phase encoding gradients 309-313 ($G_y$ in the preferred embodiment) and acquire the first two echo signals 301 and 302 as indicated at process block 401. This modified FSE pulse sequence is repeated for each slice in the scan, and all of the acquired echo signals 301 and 302 are Fourier transformed along the readout axis (x in the preferred embodiment) as indicated at process block 402. The resulting "projection" at each slice location is an array of I and Q magnitude values at locations along the readout axis (x), and these are employed to calculate the phase of the echo signal at each location as follows:

$$\phi = \tan^{-1}(I/Q) \quad (1)$$

Figure 4:
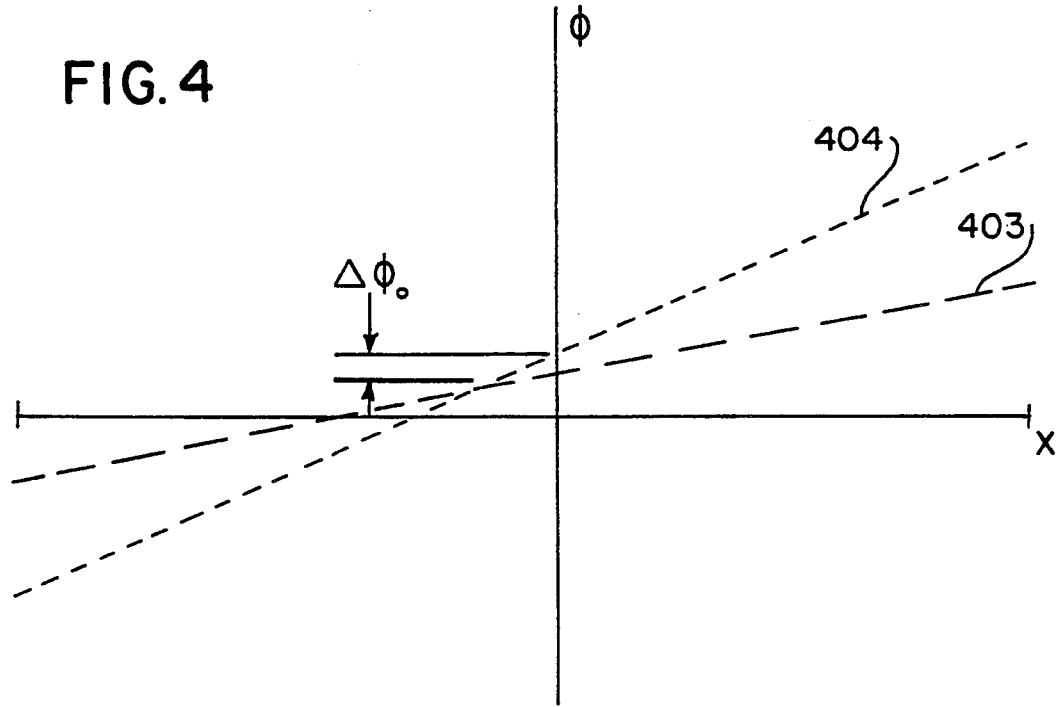
FIG. 4 is a graphic representation of the adjustments made to the FSE pulse sequence according to the present invention.

A plot of these phase values for the first echo signal 301 is illustrated, for example, by dashed line 403 in FIG. 4, and the phase values for the second echo signal 302 is illustrated by dotted line 404. Similar "phase profiles" are calculated for each slice of the scan.

Referring particularly to FIGS. 3A and 4, the next step indicated by process block 405 is to calculate the difference in phase ($\Delta\phi_0$) between the two echo signals 301 and 302 at the readout gradient isocenter. If this phase difference $\Delta\phi_0$ is less than a preset value (for example, 0.5° or 1.0°) no zero order correction is required and the process moves onward. Otherwise, the process loops back at decision block 406 and a phase correction calculation is made at process block 407. To correct the zero order phase error a correction equal to approximately one half the measured phase difference $\Delta\phi_0$ is calculated, and this angle is added to each of the 180° RF refocusing pulses 307 to alter their phase with respect to the 90° RF excitation pulse 305. This alteration of the FSE pulse sequence is performed at process block 408 for each slice of the scan.

The prescan is then performed again with the altered FSE pulse sequence for each slice. The process repeats until the phase difference of each slice is within the preset value tested at decision block 406. When this occurs the FSE pulse sequence for each slice has been altered sufficiently to correct for zero order phase shifts and for first order phase shifts along the slice select axis (i.e. z-axis in the preferred embodiment).

Referring particularly to FIGS. 3A and 4, the process continues at process block 410 to correct the FSE pulse sequence for each slice for first order phase shifts along the readout gradient axis. More specifically, the slope ($d\phi_1/dx$) of the phase profile 403 of the first echo signal 301 and the slope ($d\phi_2/dx$) of the phase profile 404 of the second echo signal 302 are calculated and the difference between these slopes ($\Delta d\phi/dx$) is measured. As indicated at decision block 411, if this difference exceeds a preset limit, the prescan loops back to further alter the FSE pulse sequence for the slice. At process block 412 a correction to the readout gradient is calculated by dividing the slope difference $\Delta d\phi/dx$ by the gyromagnetic constant $\gamma$ (i.e. 4257 Hz/gauss) to produce a readout gradient field alteration. As indicated at process block 413 this calculated gradient field adjustment is added to the readout gradient dephaser pulse 414 (FIG. 2) in the FSE pulse sequence. The prescan is then repeated until the slope difference $\Delta d\phi/dx$ for each slice is reduced below the preset level tested at decision block 411.

The FSE pulse sequences for each separate slice are thus adjusted to correct for zero order phase shifts and for first order phase shifts along the slice select and readout gradient axes. These corrections have been found adequate for most applications and most MRI systems, but further corrections may be made to further enhance image quality.

Figure 3B:
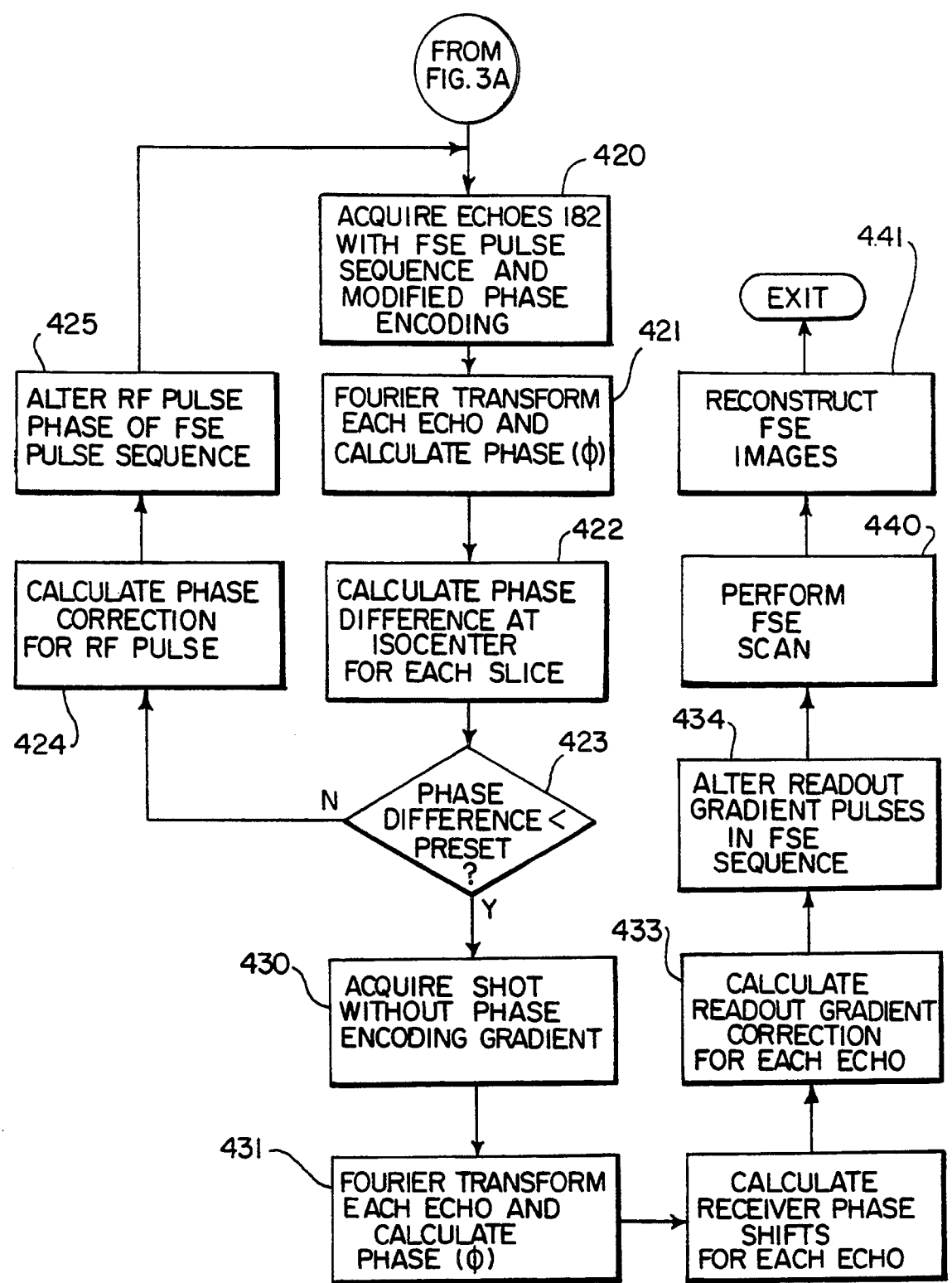

Referring particularly to FIGS. 3B and 4, zero order phase shifts due to the eddy currents produced by the phase encoding gradient $G_y$ may also be corrected using the present invention. As indicated at process block 420 two acquisitions are performed for each slice in the scan. The first acquisition employs the FSE pulse sequence adjusted as described above and without phase encoding gradients. Only the first echo signal 301 is acquired in this first acquisition. During the second acquisition, the first phase encoding pulse 309 and its rewinder pulse 309a are applied, but the subsequent phase encoding pulses are not applied and the second echo signal 302 is acquired. As was done above, both acquired echo signals are then Fourier transformed along the readout axis at process block 421 and the phase profiles 403 and 404 are calculated. The phase difference ($\Delta\phi_0$) at the x-axis isocenter is again determined from the two phase profiles 403 and 404 at process block 422, and corrections are made if it exceeds a preset amount as determined at decision block 423. If adjustment is needed, a phase correction is calculated at 424 which is substantially one-half the measured phase difference ($\Delta\phi_0/2$) and it is applied at process block 425 to shift the phase of the 90° RF excitation pulse 305 relative to the RF refocusing pulses 307. This phase adjustment is made to each of the sixteen shots for each slice of the scan until all the corresponding FSE pulse sequences produce a phase difference within the preset limit tested at decision block 423.

Another aspect of the invention is the adjustment of the FSE scan to remove artifacts from the reconstructed images. The above adjustments to the FSE pulse sequence alter the MR signals produced by the FSE pulse sequence by insuring that the proper phase relationships for the CPMG echo train are maintained. The following adjustments do not affect the underlying MR signals produced by the FSE scan, but they do improve image quality. As will be described, these adjustments to the FSE scan improve the reconstructed images without the need for a separate post processing step on the acquired MRI data.

Referring to FIG. 3b, a complete shot of sixteen echoes is acquired with each of the FSE pulse sequences altered as described above. As indicated by process block 430, this acquisition is performed with the phase encoding gradient $G_y$ turned off. A one-dimensional Fourier transformation of each acquired echo is performed and the phase ($\phi$) of each transformed I and Q sample value is calculated as indicated at process block 431. From the resulting phase profile of each echo in the shot, the phase at the readout gradient isocenter is determined at process block 432 and the result is stored with the FSE pulse sequence. When the FSE pulse sequence is played back during the scan, this "intercept" phase value is employed to offset the reference phase of the receiver in the transceiver module 150 (FIG. 1) while the echo signal is being received. As a result, the phase of each received echo signal is shifted by an amount such that its phase profile passes through zero as it intercepts the readout gradient isocenter. Thus the phase of each echo in the shots is adjusted such that their phase profiles are the same at the isocenter intercept (i.e. zero in the preferred embodiment).

Referring still to FIG. 3B, the final step in the prescan process is to calculate the slope of each echo signal phase profile as indicated at process block 433. A readout gradient adjustment is then calculated which will change their slope to a common reference value. This reference slope is calculated by averaging the slopes of the sixteen echo signal phase profiles in the shot. The readout gradient adjustment is calculated as described above, but it is applied to the specific readout gradient pulse 308 which corresponds to the echo signal being adjusted as indicated at process block 434. Referring to FIG. 2, for example, the echo signal 302 is adjusted by adding a readout gradient adjustment 435 to the readout gradient pulse 308 before echo acquisition, and subtracting the same adjustment 436 from the gradient pulse 308 after the acquisition of echo signal 302. When the adjusted FSE pulse sequence is used during the scan, as indicated at process block 440, images are reconstructed at process block 441 which are substantially free of artifacts caused by zero order and first order perturbations in the readout gradient field.

It should be apparent that many variations are possible in the preferred embodiment described above. For example, not all of the above adjustments may be required in a particular application. In such case, the prescan can be shortened. Also, the invention is described with reference to a multiple slice 2DFT scan, but it can be applied to a 3DFT scan. While shifts in the signal phase from echo to echo are typically much more severe than variations in echo amplitudes, it is also possible to employ the present invention to correct for errors due to amplitude variations. In such case, variations in the expected echo signal amplitude are measured during the prescan process and gain corrections are stored for each echo signal in the shot. During the scan, these gain corrections are applied to the transceiver 150 to adjust receiver gain as each echo signal in the shot is received. Also, the preferred embodiment of the invention corrects phase errors described as the sum of a spatially independent term plus a linear term. Phase errors that have a higher order spatial dependence can also be corrected using the present invention provided a suitable gradient coil that describes the higher order term is present in the MR system.

I claim:

1. In a magnetic resonance imaging system (FIG. 1) which performs a scan to acquire MR data using a fast spin echo pulse sequence (FIG. 2) in which an RF magnetic field is produced by an RF excitation pulse followed by a series of RF refocusing pulses and magnetic field gradients are applied to spatially encode echo signals that are acquired during the pulse sequence, a prescan in which the fast spin echo pulse sequence is adjusted prior to conducting the scan, which comprises:

1) acquiring MR data using the fast spin echo pulse sequence;

2) calculating a phase profile for each of two echo signals in the acquired MR data;

3) adjusting the relative phase of the RF excitation pulse and an RF refocusing pulse in the fast spin echo pulse sequence to reduce the magnitude of a phase difference value between the two phase profiles; and 4) repeating steps 1, 2 and 3 until the magnitude of the phase difference value is less than a preset amount.

2. The prescan as recited in claim 1 which includes:

5) adjusting the value of a magnetic field gradient in the fast spin echo pulse sequence to reduce the difference in slope of the two phase profiles; and 6) repeating steps 1, 2 and 5 until the difference in slope of the two phase profiles is less than a preset amount.

3. The prescan as recited in claim 1 in which the magnetic field gradients produced by the fast spin echo pulse sequence during the scan includes a readout magnetic field gradient produced during the acquisition of each echo signal, and a phase encoding gradient produced prior to each echo signal, and the phase encoding gradient is not produced during step 1 of the prescan.

4. The prescan as recited in claim 1 in which the magnetic field gradients produced by the fast spin echo pulse sequence during the scan includes a readout magnetic field gradient produced during the acquisition of each echo signal, and a phase encoding gradient produced prior to each echo signal, and the phase encoding gradient is produced during step 1 of the prescan such that one of said two echo signal phase profiles is phase encoded and the other phase profile is not phase encoded.

5. The prescan as recited in claim 1 in which a set of fast spin echo pulse sequences are employed to acquire a corresponding set of images during the scan, and steps 1, 2, 3 and 4 are performed using each fast spin echo pulse sequence in said set.

6. The prescan as recited in claim 1 which further includes:

7) acquiring MR data using the fast spin echo pulse sequence;

8) calculating a phase profile for each echo signal produced by the spin echo pulse sequence; and 9) calculating a receiver phase shift for each echo signal from its corresponding phase profile;

said receiver phase shifts being used during the scan to adjust the phase of the transceiver during the acquisition of each echo signal.

7. The prescan as recited in claim 6 which further includes:

10) calculating an adjustment to a readout gradient associated with each echo signal from the slope of its corresponding phase profile.

* * * * *